(12) United States Patent
Lee

(10) Patent No.: US 6,818,944 B2
(45) Date of Patent: Nov. 16, 2004

(54) NONVOLATILE MEMORY DEVICES AND METHODS OF FABRICATING THE SAME

(75) Inventor: Chang-Hyun Lee, Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/386,620

(22) Filed: Mar. 11, 2003

(65) Prior Publication Data

US 2003/0198104 A1 Oct. 23, 2003

(30) Foreign Application Priority Data

Apr. 12, 2002 (KR) .......................................... 2002-19948

(51) Int. Cl.[7] .............................................. H01L 29/792
(52) U.S. Cl. ...................... 257/324; 257/314; 257/315; 257/637; 257/640; 438/201; 438/216; 438/257; 438/261; 438/591; 438/593
(58) Field of Search ..................... 257/68–71, 296–313, 257/905–908, 239, 261, 315–326; 438/201, 211, 216, 241, 257, 258, 260–266, 591, 593

(56) References Cited

U.S. PATENT DOCUMENTS

| | | | | |
|---|---|---|---|---|
| 5,079,603 A | * | 1/1992 | Komori et al. ............. 257/316 |
| 5,168,334 A | * | 12/1992 | Mitchell et al. ............ 257/324 |
| 6,342,451 B1 | * | 1/2002 | Ahn ........................... 438/706 |
| 6,436,767 B1 | * | 8/2002 | Koishikawa ................ 438/265 |
| 6,445,030 B1 | * | 9/2002 | Wu et al. .................... 257/315 |
| 6,541,816 B2 | * | 4/2003 | Ramsbey et al. ........... 257/324 |
| 2003/0062567 A1 | * | 4/2003 | Zheng et al. ............... 257/316 |

* cited by examiner

Primary Examiner—David Nelms
Assistant Examiner—Andy Huynh
(74) Attorney, Agent, or Firm—Marger, Johnson & McCollom, P.C.

(57) ABSTRACT

A lower insulation layer, a charge storing layer, and an upper insulation layer are sequentially stacked on a substrate to form a gate insulation layer. A gate conductive layer is formed on the gate insulation layer. The gate electrode is patterned to expose a surface of the gate insulation layer. The charge storing layer is a barrier layer to oxygen diffusion during oxidization for curing etching damages caused by patterning. Thus, a gate bird's beak is prevented in the lower insulation layer. Spacers are formed on sidewalls of the gate electrode. The upper insulation layer is etched using the gate electrode and the spacers as an etch mask. Impurity ions are implanted into the substrate adjacent to the gate electrode to form an impurity region. Since an upper insulation layer is not exposed during the ion implantation process, the upper insulation layer is not damaged.

14 Claims, 19 Drawing Sheets

NONVOLATILE MEMORY DEVICES AND METHODS OF FABRICATING THE SAME

CROSS REFERENCE TO RELATED APPLICATIONS

This application claims priority from Korean Patent Application No. 2002-19948, filed on Apr. 12, 2002, the contents of which are herein incorporated by reference in their entirety for all purposes.

BACKGROUND OF THE INVENTION

1. Field of the Invention

This disclosure relates to nonvolatile memory devices and methods of fabricating the same and, more particularly, to floating trap type nonvolatile memory devices and methods of fabricating the same.

2. Description of the Related Art

The importance of nonvolatile semiconductor memories has been emphasized together with dynamic random access memories (DRAMs) and static random access memories (SRAMs). Unlike volatile random access memories (RAMs) that temporarily store used data, nonvolatile memory devices can maintain stored data even if power is cut off. In particular, electrically erasable and programmable read only memories (EEPROMs) are considered as preferable among the nonvolatile memories, because EEPROMs are capable of programming and erasing data, and readily rewriting data.

EEPROMs can be typically categorized as either bit erase memories capable of erasing and reading data in bits, or flash memories capable of erasing data in blocks of several tens to several hundreds bytes or more and writing in bits. Because the bit erase memory may selectively erase and program data in bits, the bit erase memory is easily used and applied. However, the bit erase memory needs two transistors, i.e., a memory transistor and a selection transistor, therefore, a chip size is large and the corresponding price is high. On the other hand, the flash memory is capable of programming data in bits, and erasing in all bits or in blocks. Since a memory cell of the flash memory includes one transistor, the area of the cell is relatively small.

The flash memories can be typically divided into NOR-type structures and NAND-type structures. In the NOR-type structure, cells are disposed in parallel between a bit line and a ground. In the NAND-type structure, cells are disposed in series between a bit line and a ground.

FIG. 1A is a top plan view illustrating a NAND-type structural cell according to a conventional method, and FIG. 1B is an equivalent circuit diagram illustrating the NAND-type structural cell of FIG. 1A.

Referring to FIG. 1A, a field region defines an active region 2. A word line 4 is disposed to cross the active region 2 and the field region. An area where the word line 4 crosses the active region 2 corresponds to a gate electrode 6 of a transistor. A bit line 8 is disposed at right angles to the word line 4. Reference numeral A represents a cell that is a memory data unit.

FIG. 2A is a top plan view illustrating a NOR-type structural cell according to a conventional method, and FIG. 2B is an equivalent circuit diagram illustrating the NOR-type structural cell of FIG. 2A.

Referring to FIG. 2A, a field region 12 defines an active region. A word line 14 is disposed to cross the active region and the field region 12. An area where the word line 14 crosses the active region corresponds to a gate electrode 16 of a transistor. Impurity ions are implanted into the active region of both sides of the gate electrode 16, thereby forming a source region 18 and a drain region 20. A contact 24 is formed in the drain region 20 to be connected to the bit line 22 formed at right angles to the word line 14. Reference numeral B represents a cell that is a memory data unit.

Functionally, the NAND-type flash memory has slower reading speed than the NOR-type flash memory, and has a restriction of reading and writing data by taking a number of cells connected in series to the NAND-type cell array as one block. However, as the NAND-type flash memory has a smaller cell area, fabrication costs per bit can be reduced.

The flash memory devices are either floating gate type or floating trap type. SONOS (polysilicon-oxide-nitride-oxide-silicon) structural devices are well known as a floating trap type.

While the floating gate device injects electric charges into a floating gate, the SONOS device injects electric charges into a trap disposed in a silicon nitride layer. The floating gate device has the limit of decreasing a cell size, and is subjected to high voltages for program and erase operations. On the other hand, the SONOS device meets the needs of low power and low voltage, and enables high integration.

FIGS. 3A and 3B are cross-sectional views illustrating a SONOS device according to a conventional method.

Referring to FIG. 3A, a gate insulation layer 47, which includes a lower insulation layer 42, a charge storing layer 44, and an upper insulation layer 46, is formed on a substrate 40. A gate conductive layer 48 and a silicide layer 50 are formed on the gate insulation layer 47. The gate conductive layer 48 and the silicide layer 50 are selectively etched using a hard mask pattern 52 formed by a photolithographic process. As a result, a gate stack is formed to expose a surface of the substrate 40. During the etch process, surfaces of the gate electrode 48 and the substrate 40 are damaged. Oxidization should be performed to remove the etching damages. Thus, thermal oxide layers 54a and 54b are formed on sidewalls of the gate electrode 48 and on the silicon substrate 40. At this time, a lateral diffusion of oxygen occurs at boundaries between the semiconductor substrate 40 and an edge of the lower insulation layer 42 of the gate insulation layer 47. This results in a gate bird's beak 56 that causes a thickness of the edge of the lower insulation layer 42 to be increased. Due to the gate bird's beak 56, while a dispersion of a threshold voltage Vth of the cell increases, write/erase speed is lowered. Continuously, impurity ions are implanted into the active region by using the gate stack as an ion implantation mask, to form an impurity region 58 that corresponds to a source/drain region.

Referring to FIG. 3B, in order to prevent the foregoing gate bird's beak 56, a method of patterning the gate electrode 48 without etching the gate insulation layer 47 is proposed. In this case, a nitride layer is used as the charge storing layer 44 that serves as a barrier to oxygen diffusion during the oxidization process for removing the etching damages of the patterned gate electrode 48. In other words, because the oxygen is cut off by the charge storing layer 44, the bird's beak is not generated in the lower insulation layer 42 that is an oxide layer. Nevertheless, in the subsequent ion implantation process for forming the source/drain region, the exposed upper insulation layer 46 is attacked due to the ion implantation. As a result, the nonvolatile memory device does not normally program and erase data. In addition, an adhesion between the upper insulation layer and an interlayer dielectric layer (ILD), which will be formed in a subsequent process, is weakened by defects due to the ion implantation process.

Embodiments of the invention address these and other limitations of the prior art.

SUMMARY OF THE INVENTION

Embodiments of the invention provide nonvolatile memory devices and methods of fabricating the same that can prevent a bird's beak during the oxidization process that is performed to cure etching damages after patterning a gate electrode.

Embodiments of the invention also provide nonvolatile memory devices and methods of fabricating the same that can prevent damage of an upper insulation layer by removing the upper insulation layer before an ion implantation process for forming a source/drain region.

These features of the invention can be achieved by nonvolatile memory devices that include a substrate, a field region disposed at the substrate to define an active region, a plurality of gate electrodes crossing a predetermined region of the active region, and a gate insulation layer intervened between the active region and the gate electrode. The gate insulation layer includes a lower insulation layer, a charge storing layer, and an upper insulation layer. Also, an impurity region is formed in the active region between the gate electrodes. At this time, the lower insulation layer is extended between the gate electrodes to be formed on the active region. That is, the lower insulation layer is disposed on an entire surface of the active region. Also, the charge storing layer may be formed to be extended between the gate electrodes, and spacers may be formed on sidewalls of the gate electrode.

Other features of the invention can be achieved by methods of fabricating the nonvolatile memory devices that include forming a gate insulation layer by sequentially stacking a lower insulation layer, a charge storing layer, and an upper insulation layer on a substrate. A gate conductive layer is formed on the gate insulation layer and selectively etched, thereby forming a gate electrode exposing a surface of the gate insulation layer. After patterning the gate electrode, oxidization is performed to cure etching damages. At this time, since the charge storing layer of the gate insulation layer serves as a barrier layer to oxygen diffusion, a gate bird's beak is prevented. Spacers are formed on sidewalls of the gate electrode. The upper insulation layer is then selectively etched by using the gate electrode and the spacers as an etch mask. Impurity ions are implanted into the substrate adjacent to the gate electrode to form an impurity region. In this case, because the upper insulation layer is removed before the ion implantation process, the upper insulation layer is prevented from damage caused by the ion implantation.

DETAILED DESCRIPTION OF THE INVENTION

Figure 1A:
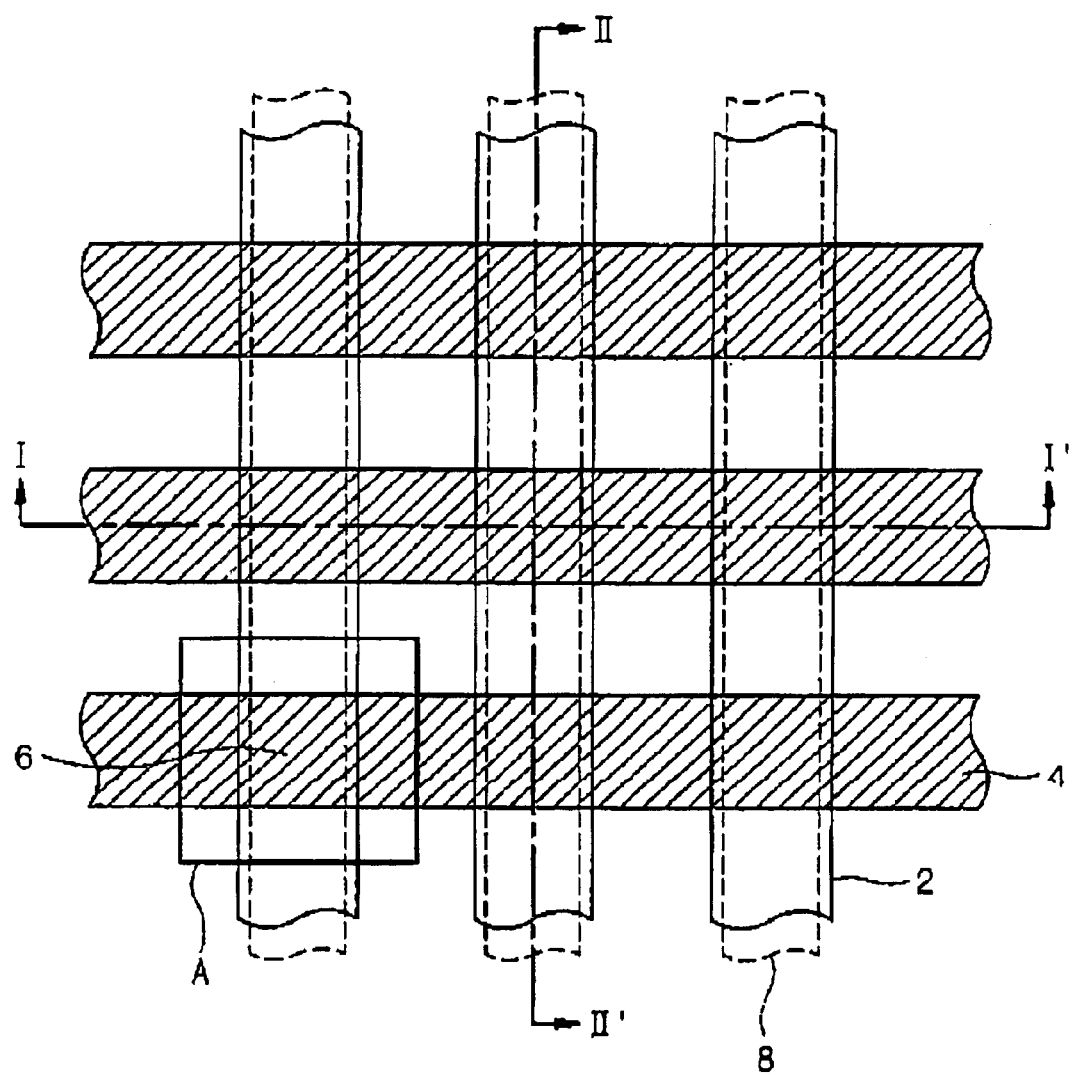
FIGS. 1A and 1B are a top plan view and an equivalent circuit diagram illustrating a NAND-type structural cell according to a conventional method.
Figure 1B:
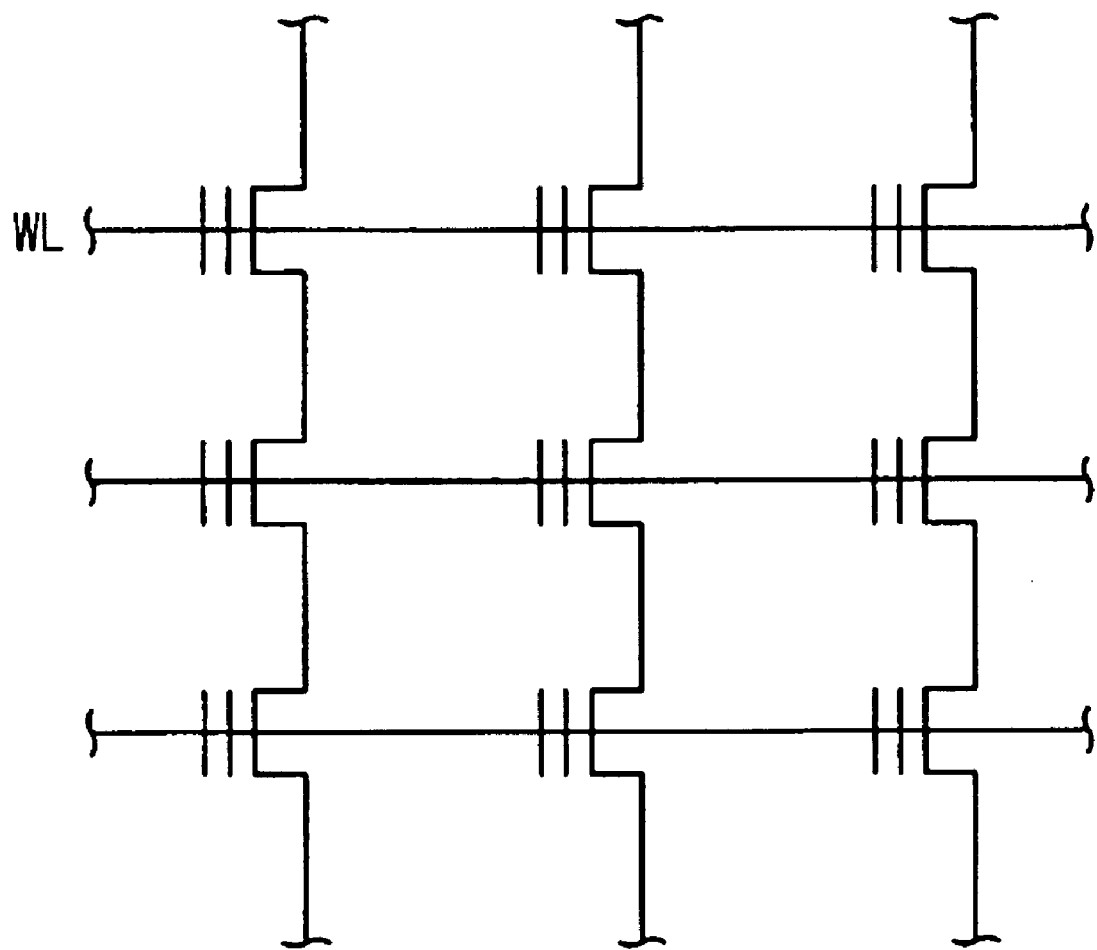
Figure 2A:
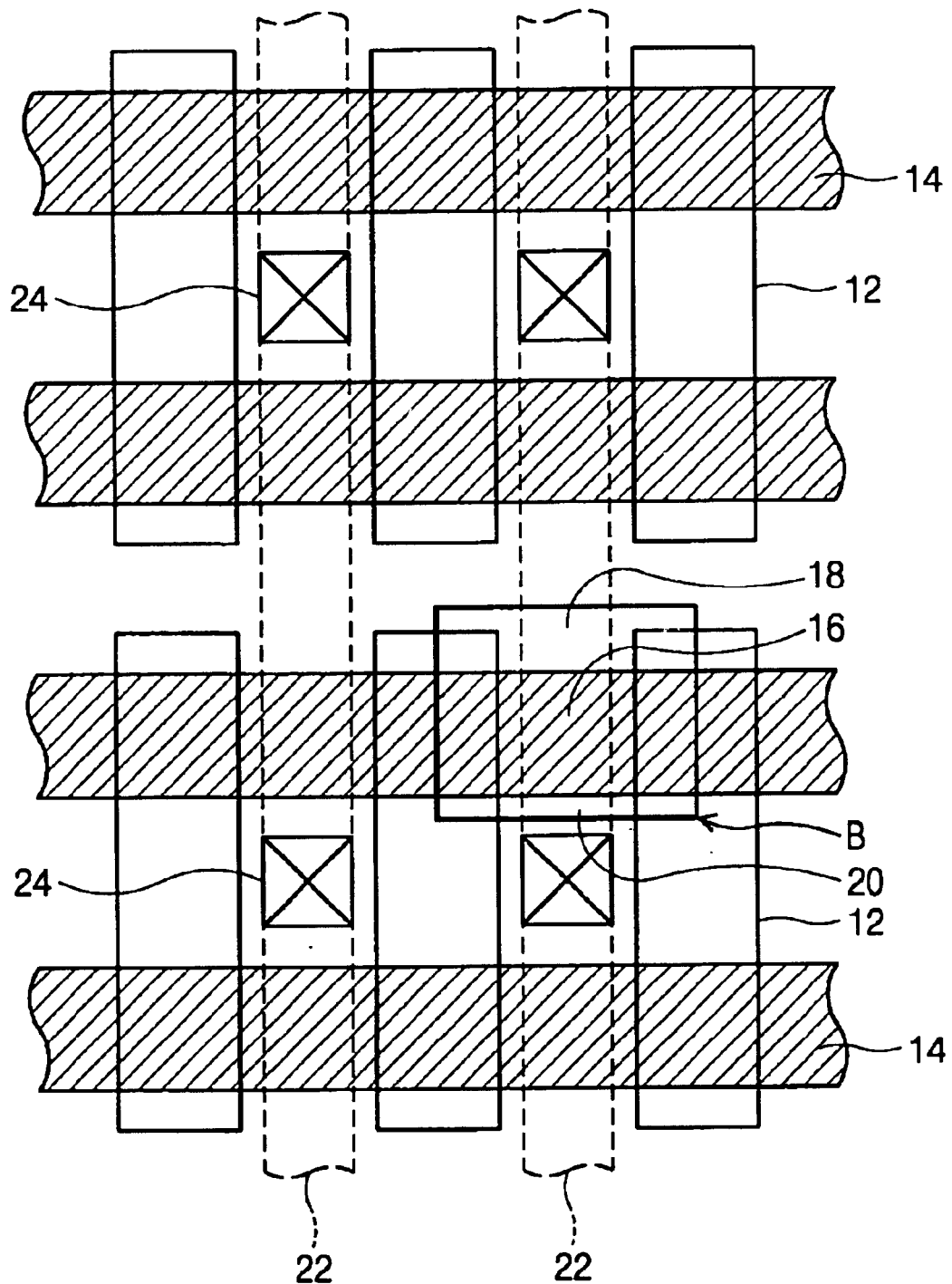
FIGS. 2A and 2B are a top plan view and an equivalent circuit diagram illustrating a NOR-type structural cell according to a conventional method.
Figure 2B:
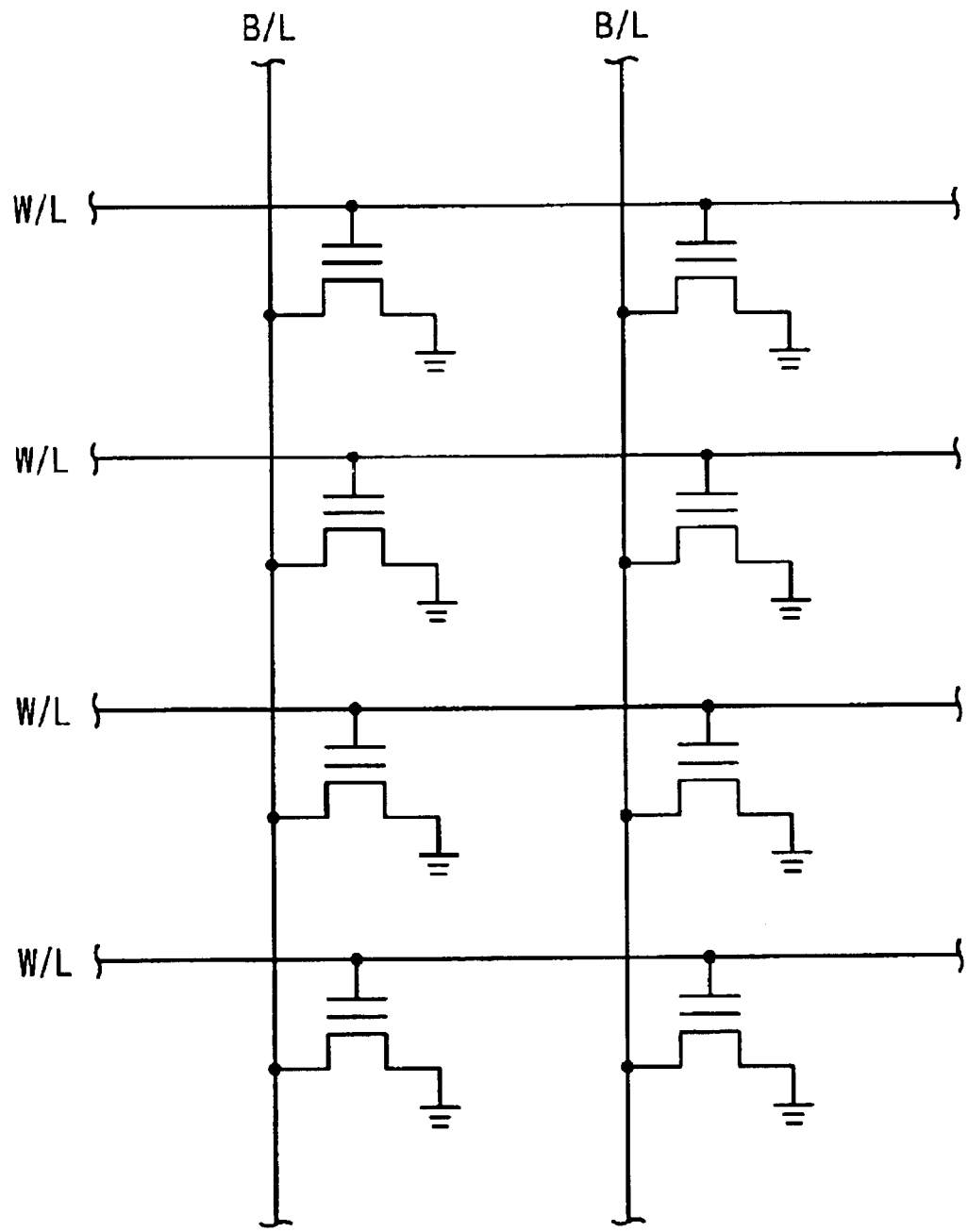
Figure 3A:
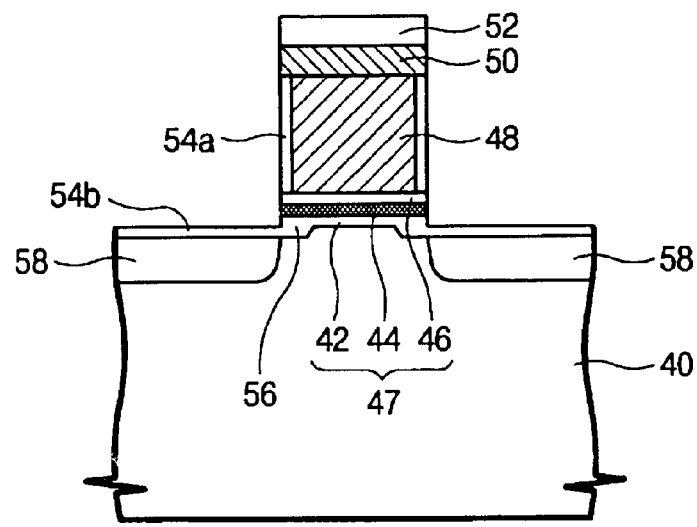
FIGS. 3A and 3B are cross-sectional views illustrating a SONOS device according to a conventional method.
Figure 3B:
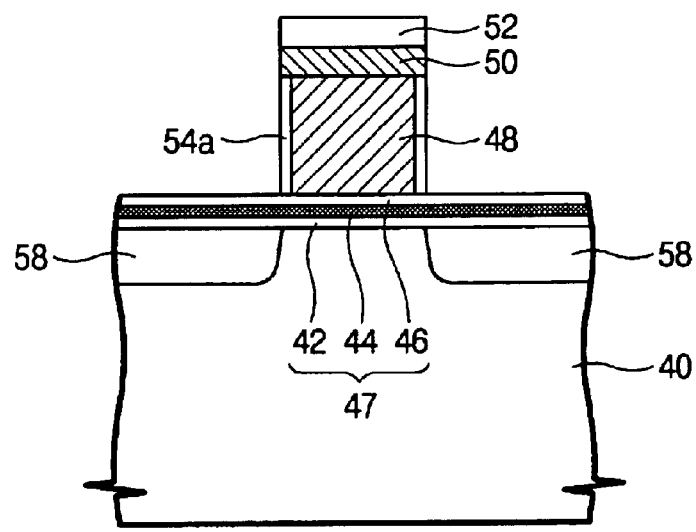

The invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 4–8 illustrate a floating trap type nonvolatile memory device according to embodiments of the invention. These embodiments are of NAND-type flash memory cells, with a structure comparable to the conventional NAND-type flash memory cell illustrated in FIG. 1A. That is, the word line and active regions of the described embodiments overlap in the same manner as that shown for the conventional device of FIG. 1A.

Figure 4:
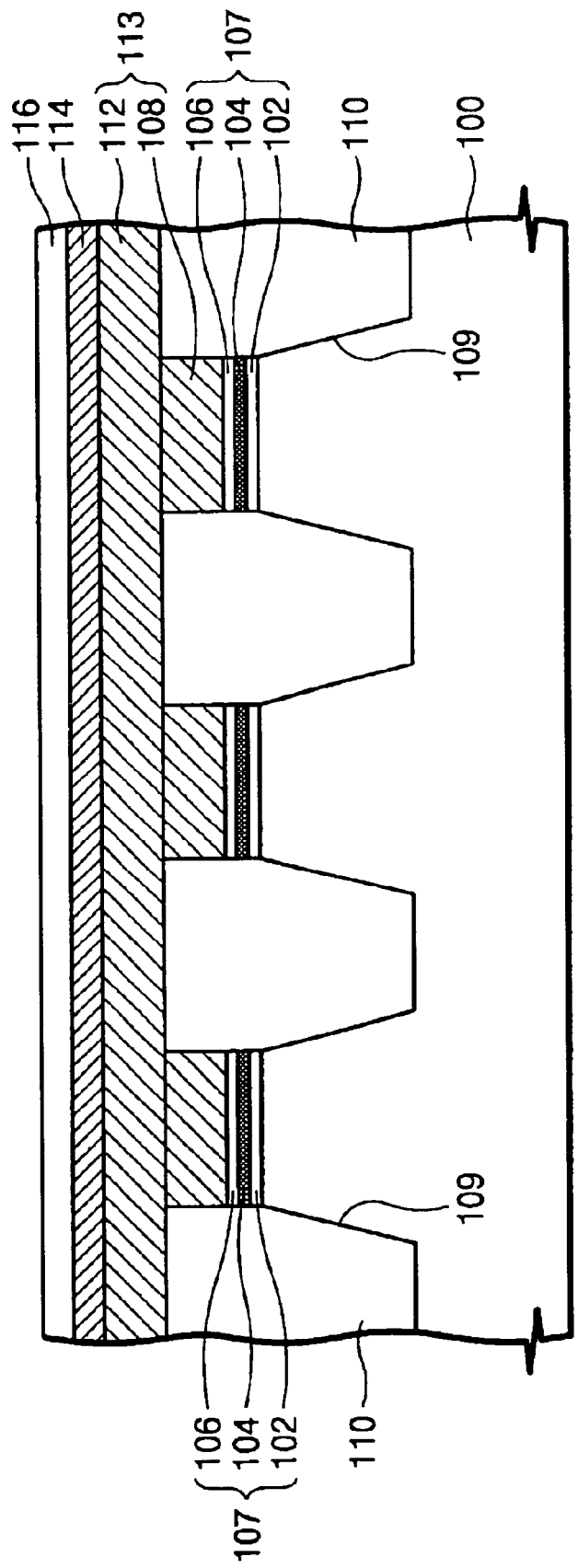
FIG. 4 is a cross-sectional view illustrating a floating trap type nonvolatile memory device according to embodiments of the invention.

FIG. 4 is a cross-sectional view of embodiments of the invention taken along a plane that is parallel to the word lines. That is, a plane comparable to the plane containing line I–I' of the conventional NAND-type flash memory cell of FIG. 1A. FIGS. 5–8 are cross-sectional views of embodiments of the invention taken along a plane that is perpendicular to the word lines. That is, a plane comparable to the plane containing line II–II' of the conventional NAND-type flash memory cell of FIG. 1A. Thus, while each of the embodiments of the invention described in the disclosure has a different structure in the plane perpendicular to the word lines (FIGS. 5–8), each embodiment has the same structure in the plane parallel to the word lines (FIG. 4).

Figure 5:
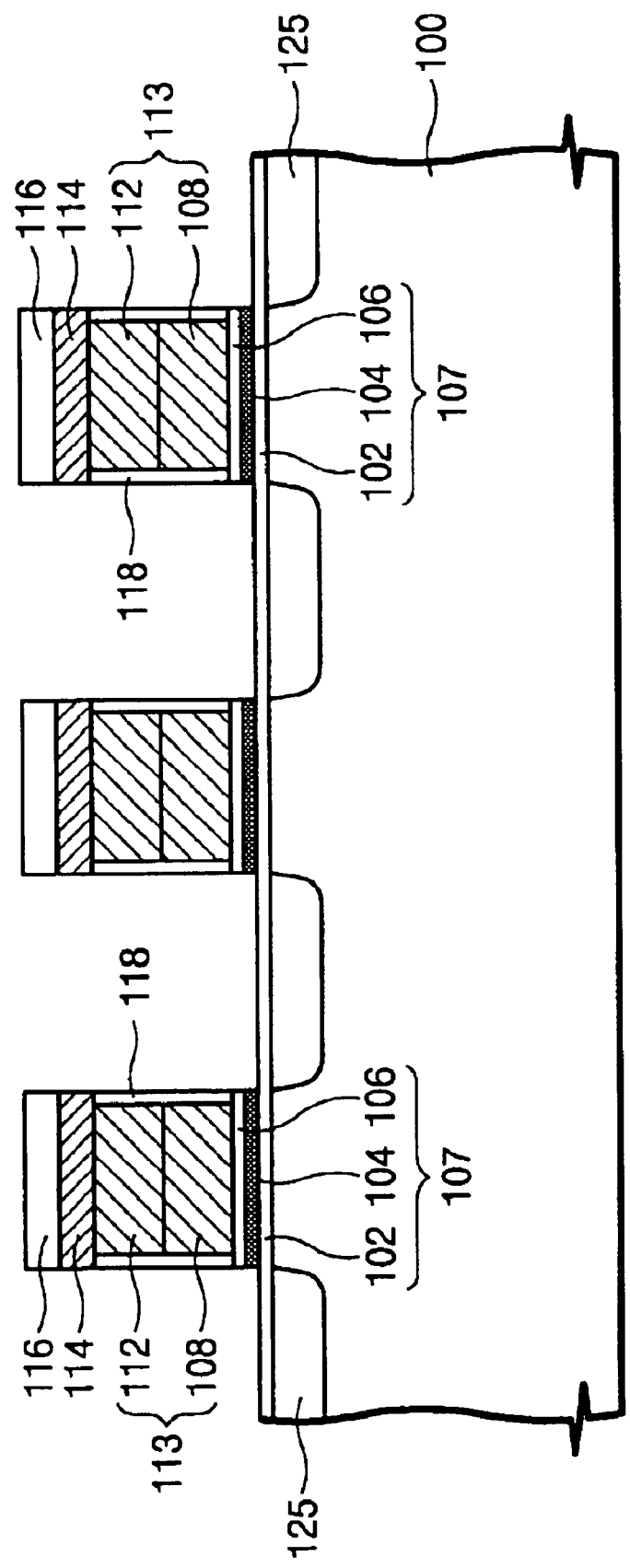
FIG. 5 is a cross-sectional view illustrating a floating trap type nonvolatile memory device according to an embodiment of the invention.

FIG. 5 is a nonvolatile memory device according to an embodiment of the invention. Referring to FIGS. 4 and 5, a field region 110 is disposed at a substrate 100 to define an active region 110. A number of gate electrodes 113 are formed to cross a predetermined region of the active region. A gate insulation layer 107, which includes a lower insulation layer 102, a charge storing layer 104, and an upper insulation layer 106, is intervened between the active region and the gate electrode 113. A thin thermal oxide layer 118 is disposed on sidewalls of the gate electrode 113. The thin thermal oxide layer 118 is formed during oxidization and cures the etching damage caused by patterning the gate electrode 113. The gate electrode 113 includes a lower gate electrode 108 and an upper gate electrode 112. The upper gate electrode 112 crosses over the field region 110 to exhibit a line-shape connecting a plurality of the gate electrodes 113. A silicide layer 114 and a hard mask layer 116 may be formed on the gate electrode 113. An impurity region 125 that is a source/drain region is disposed in the active region between the gate electrodes 113. A lower insulation layer 102 is disposed on the active region between the gate electrodes 113. That is, a lower insulation layer 102 is disposed on an entire surface of the active region.

Figure 6:
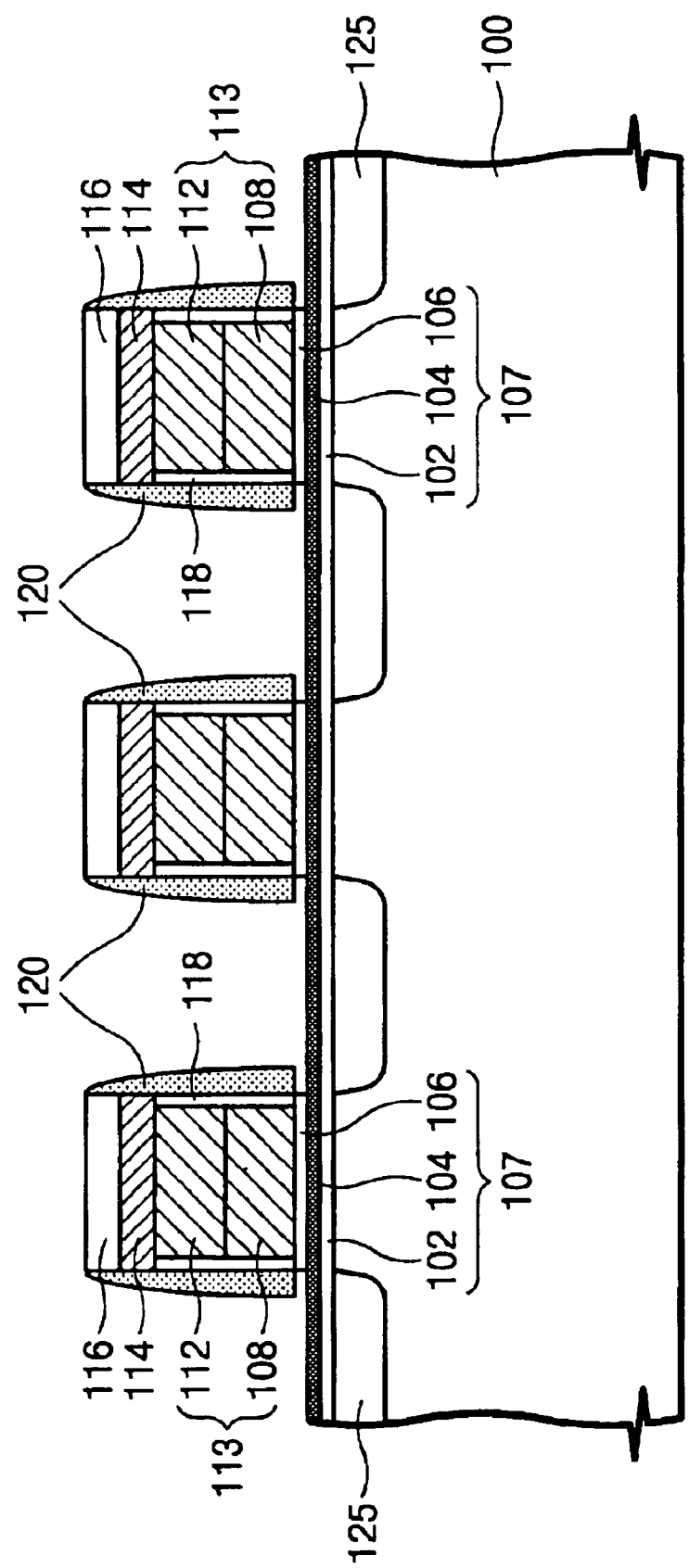
FIG. 6 is a cross-sectional view illustrating a floating trap type nonvolatile memory device according to another embodiment of the invention.

FIG. 6 is a nonvolatile memory device according to another embodiment of the present invention. Referring to FIG. 6, as compared with the foregoing memory device of FIG. 5, a charge storing layer 104 is extended onto the active regions between the gate electrodes 113. Spacers 120 are additionally disposed on sidewalls of the gate electrode 113. In other words, the lower insulation layer 102 and the charge storing layer 104 are disposed on an entire surface of the active region.

Figure 7:
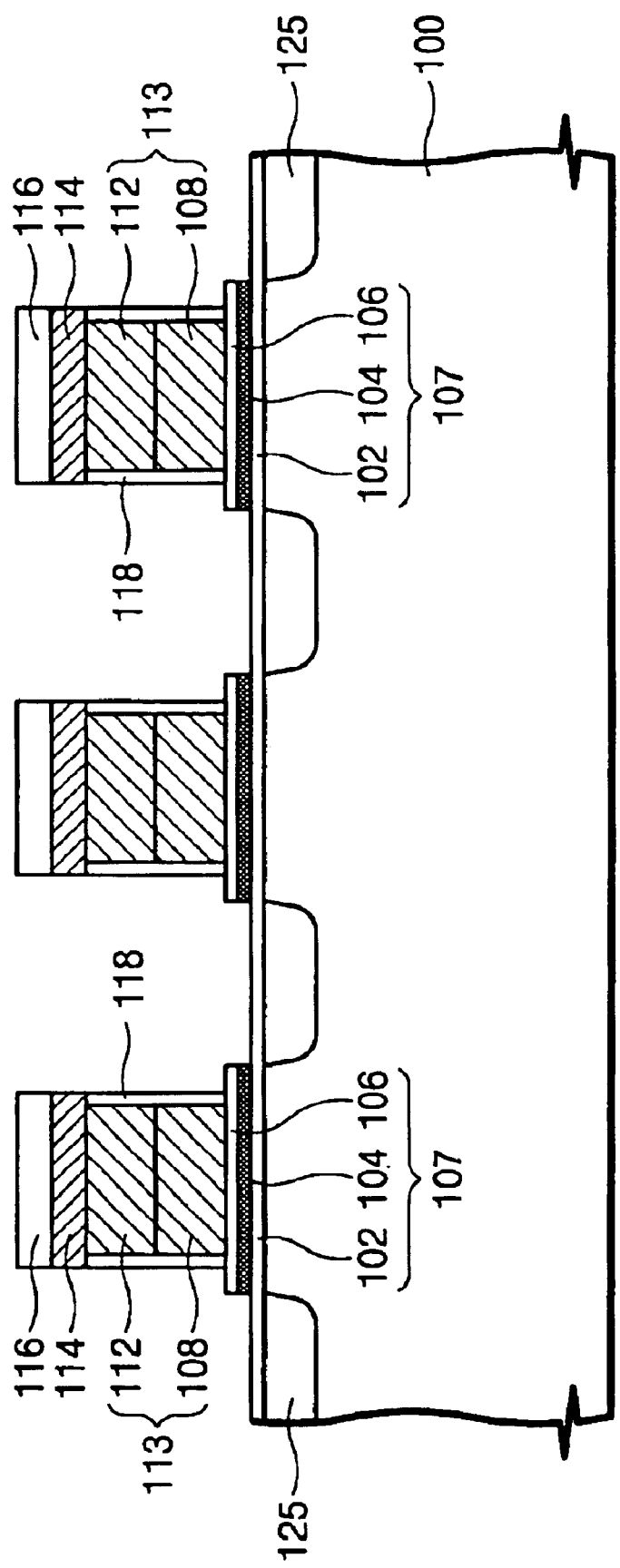
FIG. 7 is a cross-sectional view illustrating a floating trap type nonvolatile memory device according to yet another embodiment of the invention.

FIG. 7 is a nonvolatile memory device according to yet another embodiment of the present invention. Referring to FIG. 7, the nonvolatile memory device of this embodiment is similar to the memory device of FIG. 5. Unlike the embodiment of FIG. 5, the charge storing layer 104 and the upper insulation layer 106 partially extend from under the gate electrodes 113 in the direction of the active region where the impurity region 125 is formed. This configuration enables the impurity region 125 to have a narrower width.

Figure 8:
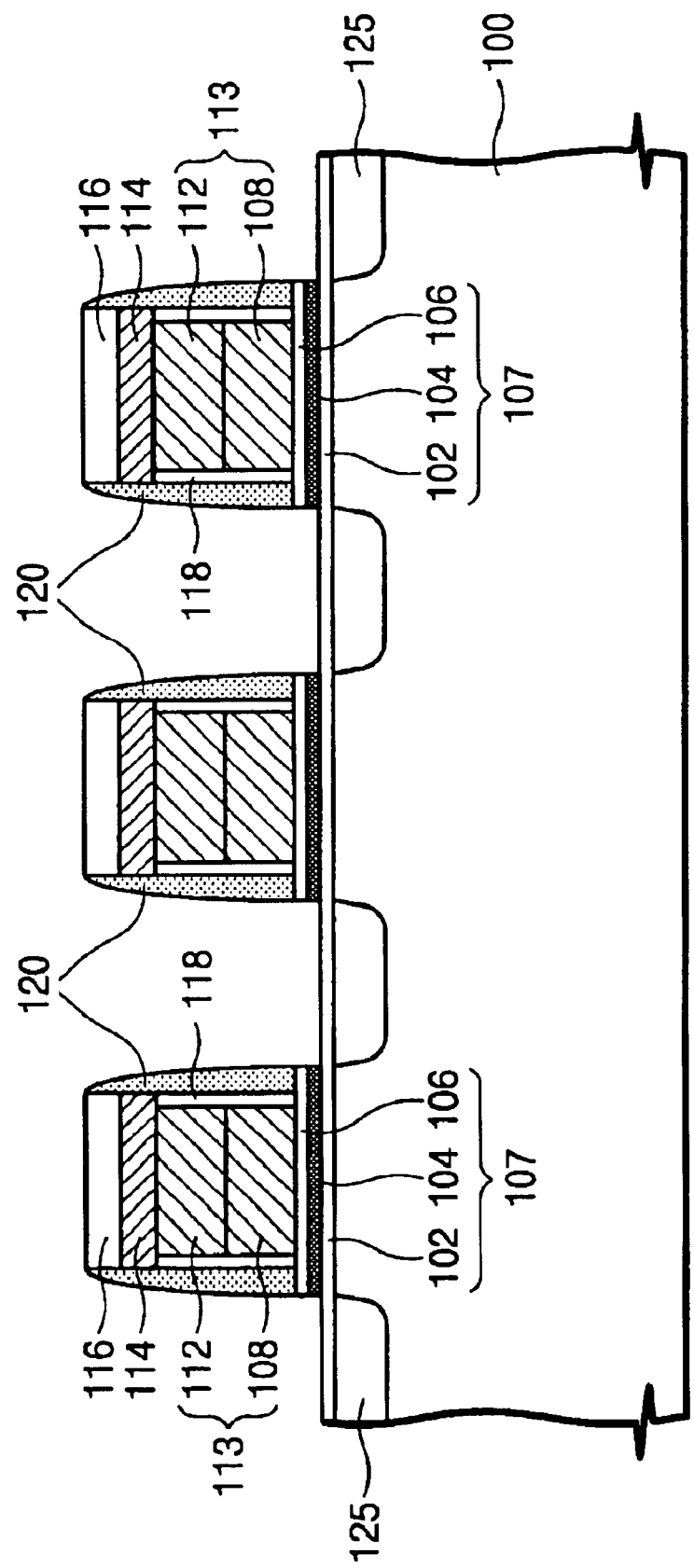
FIG. 8 is a cross-sectional view illustrating a floating trap type nonvolatile memory device according to still another embodiment of the invention.

FIG. 8 is a nonvolatile memory device according to still another embodiment of the present invention. Compared to the memory device of FIG. 7, in FIG. 8 spacers 120 are additionally on sidewalls of the gate electrode 113. A bottom of the spacer 120 is in contact with the partially extended upper insulation layer 106. This configuration enables the impurity region 125 to have a narrower width.

Hereinafter, methods for fabricating the nonvolatile memory device of the foregoing embodiments will be described.

Figure 9:
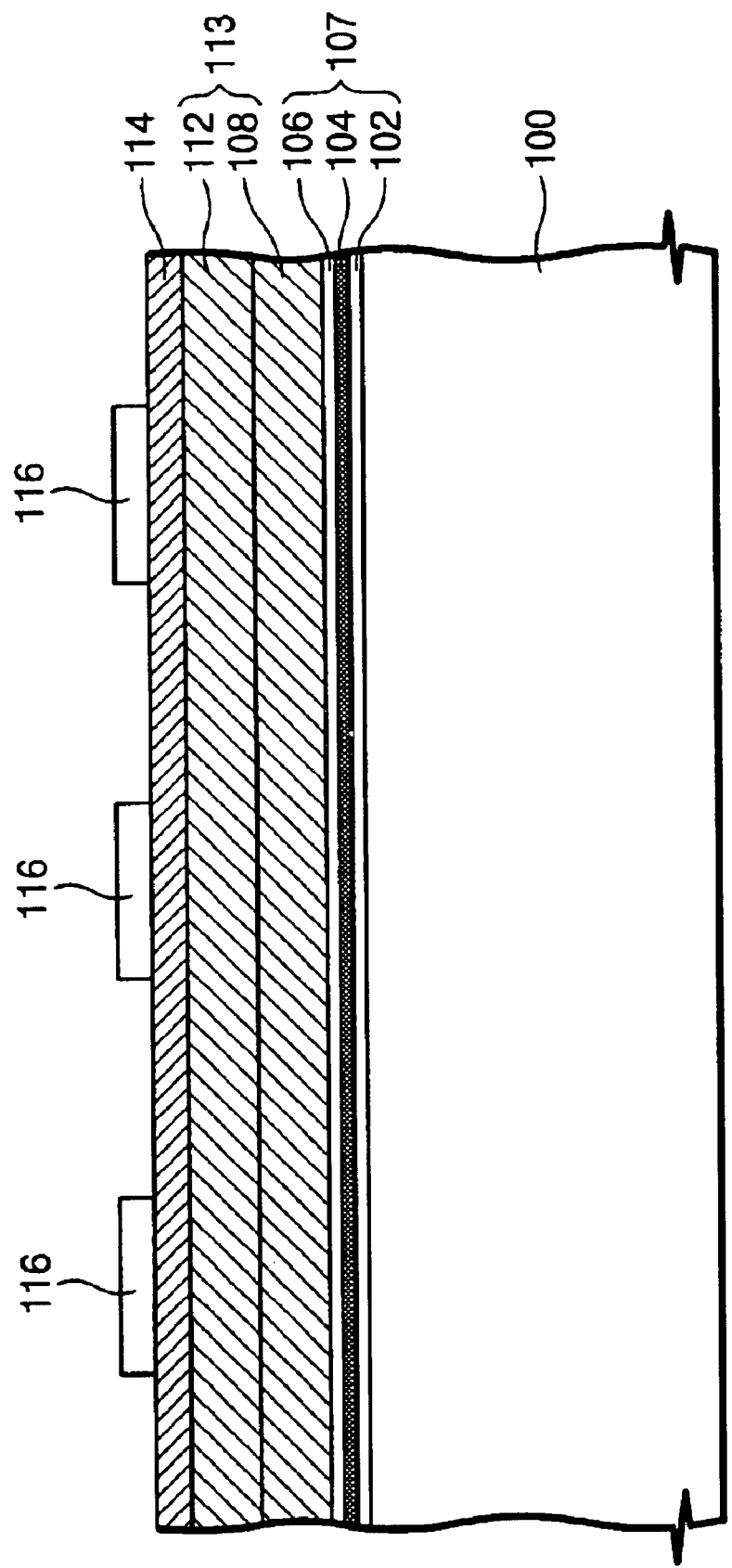
FIGS. 9–13 are cross-sectional views that illustrate some methods used to fabricate the embodiments of FIGS. 5–8.

Referring to FIGS. 9 and 4, a lower insulation layer 102, a charge storing layer 104, and an upper insulation layer 106 are sequentially stacked on a substrate 100 to form a gate insulation layer 107. The lower insulation layer 102 may be a silicon oxide layer. The charge storing layer 104 may be a silicon nitride (SiN) layer, and, in operation, charges may be trapped between the charge storing layer 104 and the lower insulation layer 102. The upper insulation layer 106 may be a silicon oxide layer. In addition, the upper insulation layer 106 may be composed of a high k-dielectric layer.

In the case where the upper insulation 106 is composed of a high k-dielectric layer, the device may exhibit stable erase characteristics as compared with a conventional device of oxide-nitride-oxide (ONO) structure. That is, when an erase operation is performed, a lower electric field is applied to the upper insulation layer than the lower insulation layer due to a difference in a dielectric constant between the lower and upper insulation layers. This makes it possible to prevent a leakage current from a gate electrode.

The upper insulation layer 106 has a high dielectric constant that may be composed of metal oxides of elements from group III (Al, Ga, In, Ta, Sc, La, and the like) or group VB (P, As, Sb, Bi, and the like) of the Mendeleev Periodic Table, oxides obtained by doping elements of group IV into said metal oxides, one of $HfO_2$ and $Hfl$-$xAlxOy$, or a combination of said materials.

Next, a lower gate conductive layer 108 is formed on the upper insulation layer 106. The lower gate conductive layer 108 may be composed of polysilicon, and has a thickness of about 500 Å.

Continuously, the lower gate conductive layer 108 and the gate insulation layer 107 are selectively etched using a mask pattern (not shown) that is formed by a photolithographic process as an etch mask. As a result, a lower gate line 108 is formed to expose a surface of the substrate 100. The semiconductor substrate 100 is then etched using the same mask to form a trench 109. An insulating material covers the mask pattern (not shown) and sufficiently fills the trench 109. The insulating material is planarized using a chemical mechanical polishing (CMP) until the mask pattern (not shown) is exposed. Thus, a field region 110 is formed to fill a gap between the trench 109 and the lower gate electrode line 108.

Next, the mask patterned is removed, and an upper gate conductive layer 112 is formed on an entire surface of the substrate. The upper gate conductive layer 112 may be composed of polysilicon. The lower gate line 108 and the upper gate conductive layer 112 constitute a gate conductive layer 113.

Thereafter, a salicide process is carried out to form a silicide layer 114 on the upper gate conductive layer 112, and this lowers the resistance of the gate conductive layer 113. The silicide layer 114 may be formed of one element selected from the group consisting of cobalt (Co), titanium (Ti), nickel (Ni), tungsten (W), platinum (Pt), hafnium (Hf), and palladium (Pd).

Next, a hard mask layer is formed on the gate conductive layer 113 where the silicide layer 114 is formed, and then patterned to form a hard mask 116. The hard mask layer may be composed of one selected from the consisting of silicon oxide, silicon nitride, silicon carbide (SiC), polysilicon, metal oxides, and metals.

Figure 10:
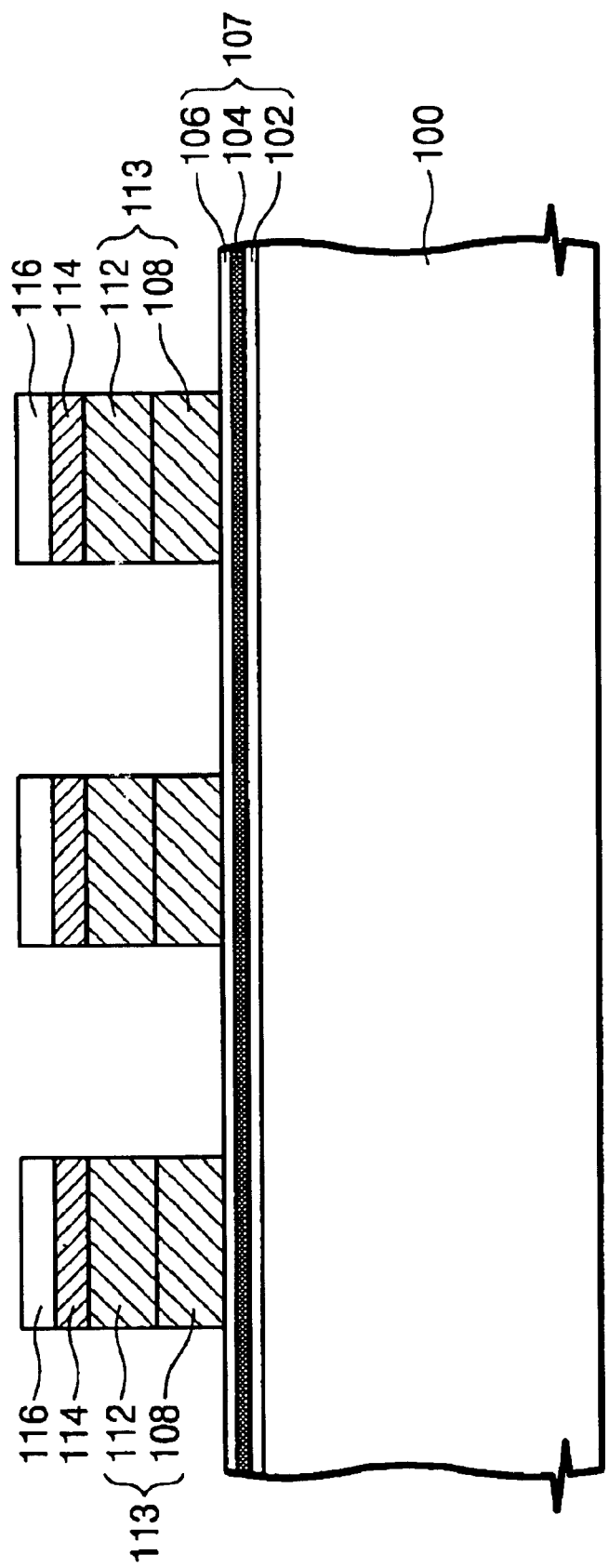

Referring to FIG. 10, the gate conductive layer 113 where the silicide layer 114 is formed is patterned by using the patterned hard mask 116 until a surface of the gate insulation layer 107 is exposed. Thus, the patterned silicide layer 114 and the patterned gate electrode 113 are formed. The gate electrode 113 includes the upper and lower gate electrodes 112 and 108. The lower gate electrode 108 is patterned twice through the device isolation process and gate electrode formation process. The upper gate electrode 112 is a line-shape crossing the field region 110 to connect a plurality of adjacent gate electrodes.

Figure 11:
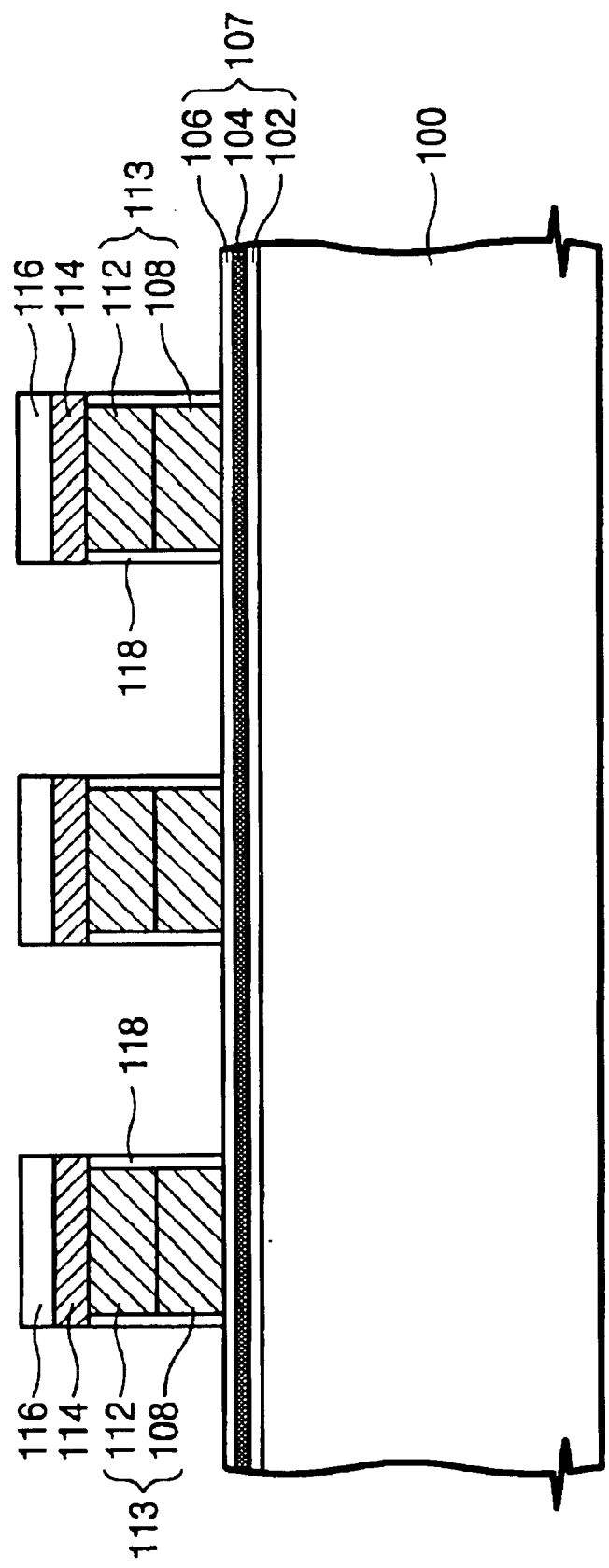

Referring to FIG. 11, the patterned gate electrode 113 is oxidized to cure etching damages caused by patterning. A thermal oxide layer 118 is formed on sidewalls of the gate electrode 113 due to the oxidization. At this time, since the charge storing layer 104 cuts off a path of oxygen from the lower insulation layer 102, the lower insulation layer 102 is not oxidized and a bird's beak is prevented.

Figure 12:
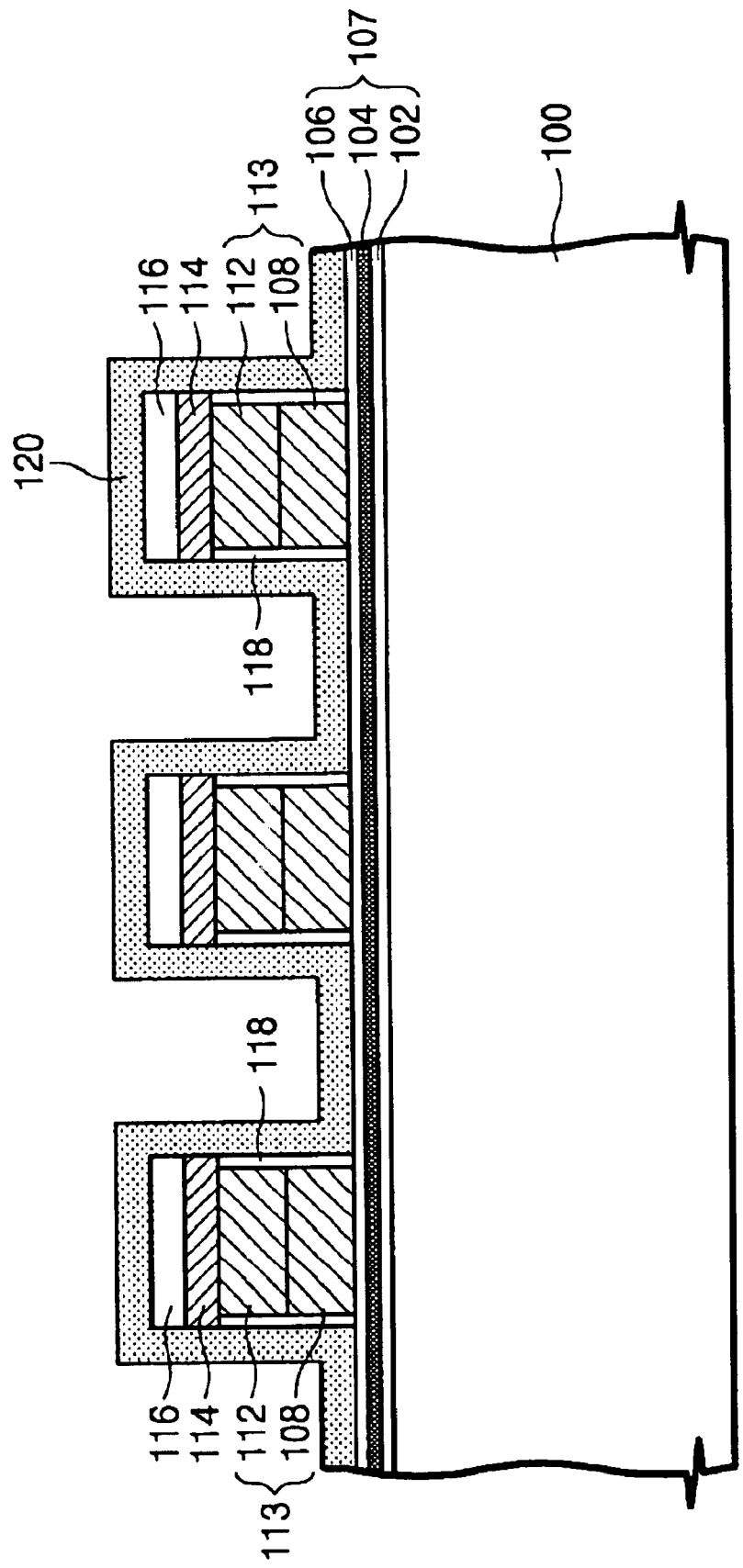

Referring to FIG. 12, a spacer insulation layer 120 is formed on an entire surface of the substrate including the gate electrode 113 where the oxide layer 118 is formed. The spacer insulation layer may be a silicon nitride (SiN) layer.

Figure 13:
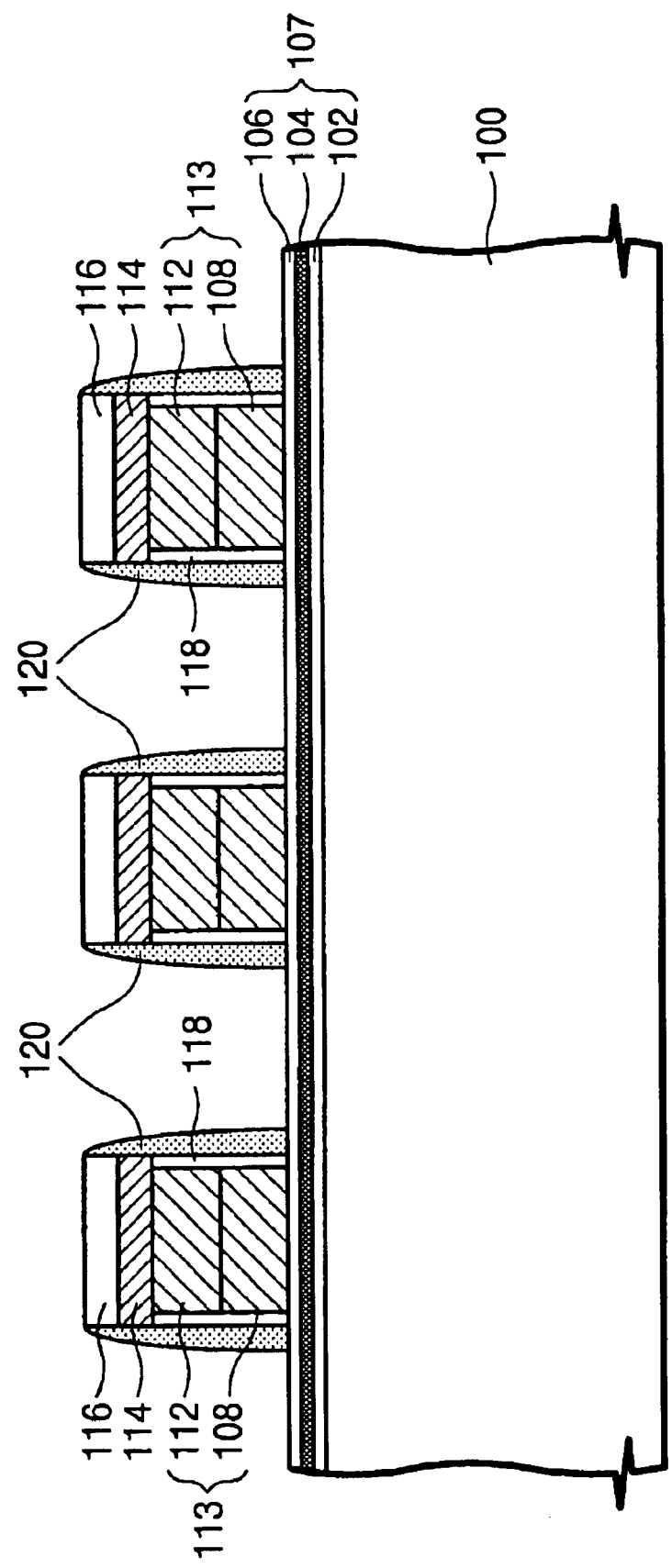

Referring to FIG. 13, the spacer insulation layer is etched using a dry anisotropic etch process to form spacers 120 on sidewalls of the gate electrode 113.

Figure 14:
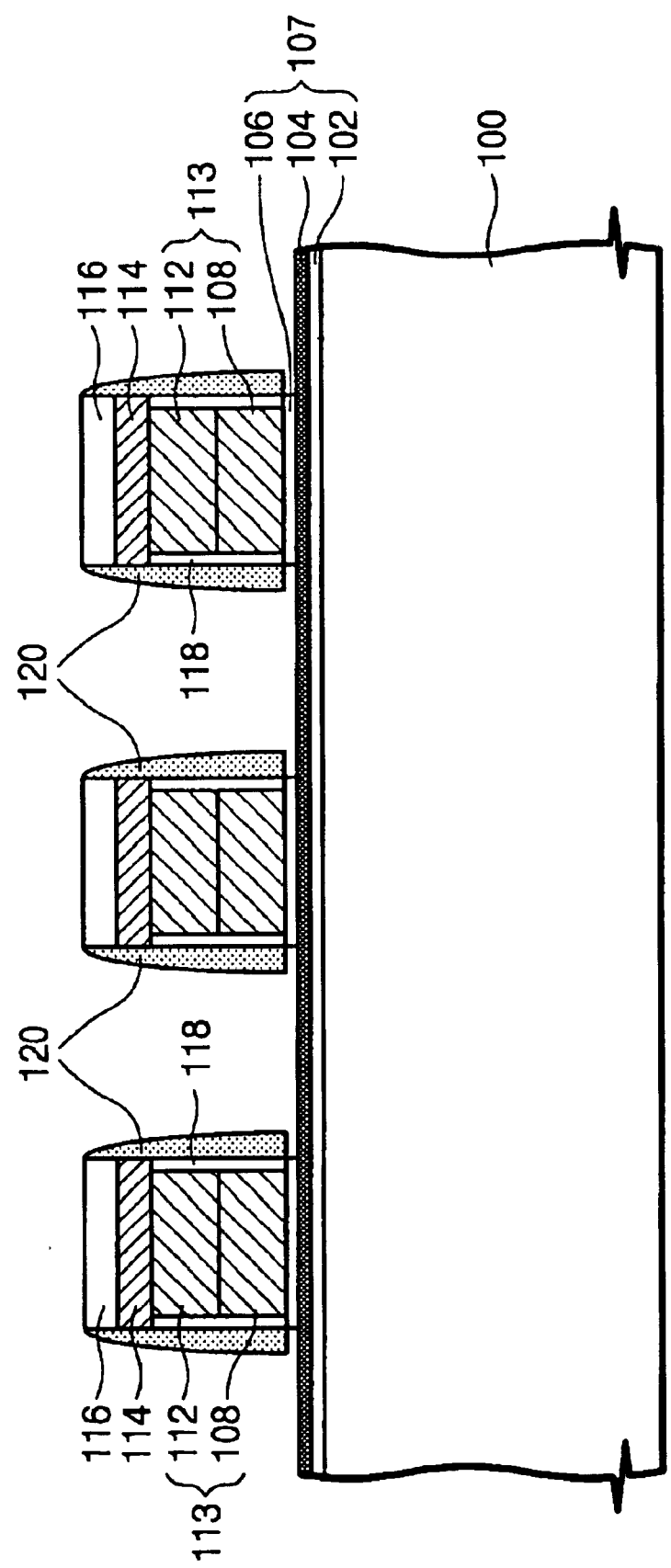
FIG. 14 is a cross-sectional view that illustrates a method used to fabricate the embodiments of FIGS. 5 and 6.

Referring to FIG. 14, the upper insulation layer 106 is removed using a wet etch process, to expose a surface of the charge storing layer 104. LAL may be used as an etchant for the wet etch process. When the upper insulation layer 106 is etched using a wet etch process, the spacers 120 protect the sidewalls of the gate electrode 113 from the etchant.

Figure 15:
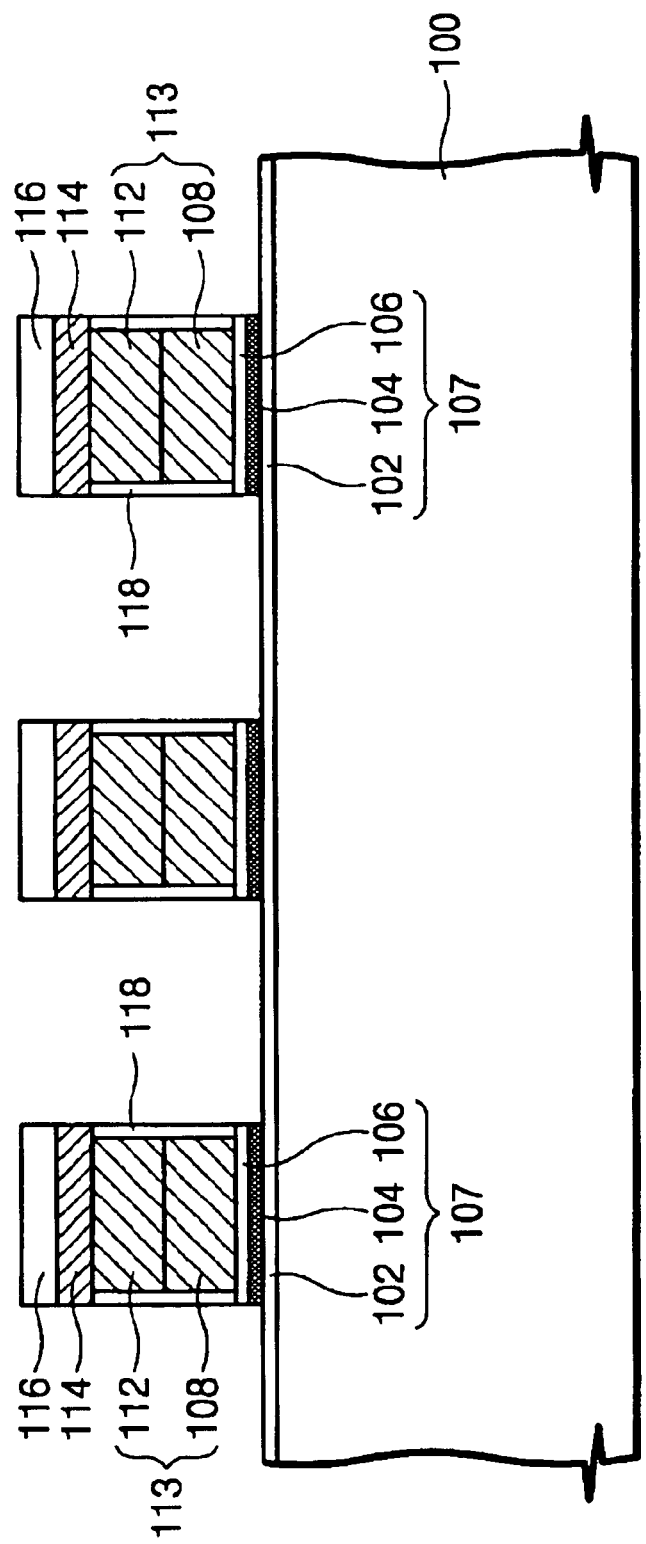
FIG. 15 is a cross-sectional view that illustrates a method used to fabricate the embodiment of FIG. 5.

Referring to FIG. 15, the spacers 120 and the exposed charge storing layer 104 are removed. In the event that the spacers 124 and the exposed charge storing layer 104 are composed of silicon nitride, they may be removed at the same time by a wet etch process using a phosphoric acid. At this time, the hard mask pattern 116 may be removed together.

By using the gate electrode 113 as an ion implantation mask, impurity ions are implanted into the active region to form an impurity region 125 that corresponds to a source/drain region. As a result, a nonvolatile memory device illustrated in FIG. 5 is formed. Because the upper insulation layer 106 was removed between the gate electrodes 113 before the ion implantation process, the upper insulation layer 106 is not attacked during the ion implantation for forming the impurity region 125. Therefore, stable device characteristics are obtained.

The processes illustrated in FIGS. 9 to 14 are also applied to the embodiment of the invention illustrated in FIG. 6. However, for this embodiment impurity ions are implanted into the active region by using the gate electrode 113 and the spacers 120 as an ion implantation mask, forming an impurity region 125 that corresponds to a source/drain region. Thus, the nonvolatile memory device illustrated in FIG. 6 is formed.

Unlike the embodiment illustrated in FIGS. 4 and 5, in the embodiment of FIG. 6 the charge storing layer 104 is not removed between the spacers 120 and the gate electrode 113, and an ion implantation process is implemented to form a source/drain region.

Figure 16:
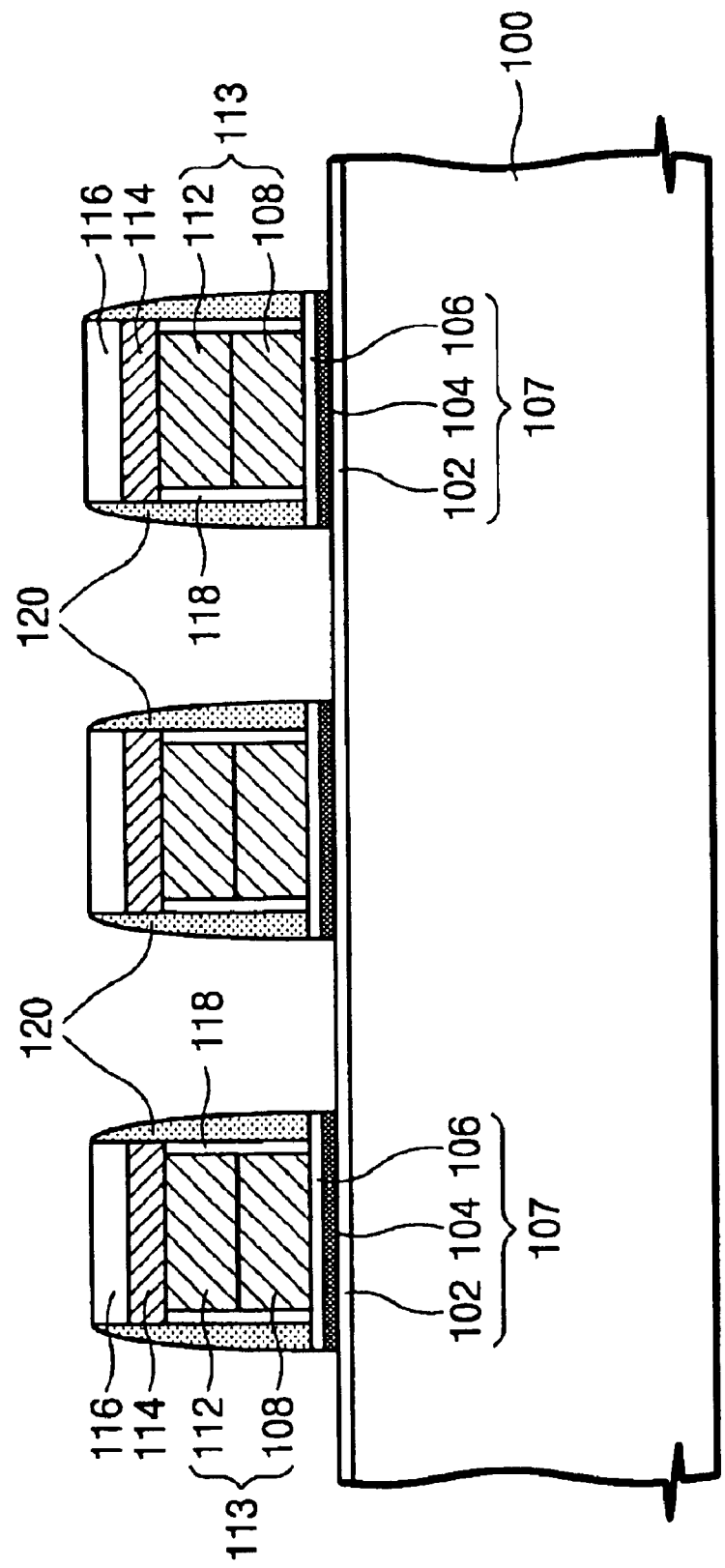
FIG. 16 is a cross-sectional view that illustrates some methods used to fabricate the embodiments of FIGS. 7 and 8.
Figure 17:
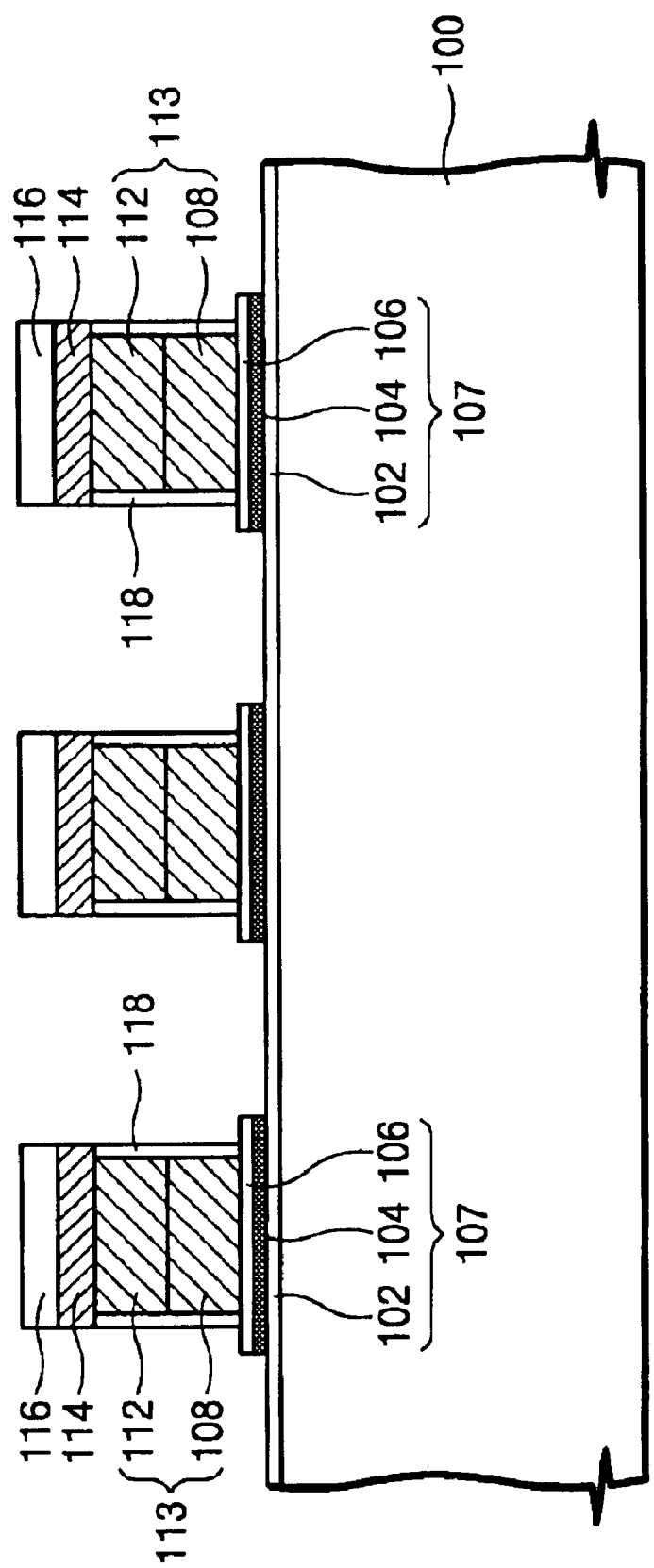
FIG. 17 is a cross-sectional view that illustrates a method used to fabricate the embodiment of FIG. 7.

FIGS. 16 and 17 are cross-sectional views illustrating a method of fabricating a floating trap type nonvolatile memory device according to the embodiment of the invention illustrated in FIG. 7. The processes illustrated by FIGS. 9 to 13 are also applied to the embodiment of FIG. 7.

Referring to FIG. 16, the upper insulation layer 106 and the charge storing layer 104, which are exposed between the gate electrodes 113, are successively etched by using the gate electrode 113 and the spacers 120 as an etch mask, exposing a surface of the lower insulation layer 102.

Referring to FIG. 17, the spacers 120 are removed by a wet etch process. In cases where the spacers are a silicon nitride layer, the spacers 120 and the hard mask 116 may be removed simultaneously using a phosphoric acid. If the spacers 120 are removed, the upper insulation layer 106 and the charge storing layer 104 are extended by a width of the removed spacer.

By using the gate electrode 113, the extended upper insulation layer 106, and the charge storing layer 104 as an ion implantation mask, an impurity region 125 corresponding to a source/drain region is formed. As a result, the nonvolatile memory device illustrated in FIG. 7 is achieved. The impurity region 125 is now narrower by an extended width of the upper insulation layer 106 and the charge storing layer 104. Accordingly, a reduction of the channel length in proportion to a design rule is avoided.

The processes illustrated in FIGS. 9–13 and 16 are applied to the embodiment of FIG. 8 as well.

To arrive at the embodiment of FIG. 8, impurity ions are implanted by using the gate electrode 113 and the spacers 120 as an ion implantation mask, forming an impurity region 125 that corresponds to a source/drain region. Thus, the nonvolatile memory device illustrated in FIG. 8 is formed. Because the impurity region 125 is narrower by a width of the spacer 120, the reduction of the channel length in proportion to a design rule is avoided.

According to embodiments of the invention described above, in a method of fabricating a floating trap type memory device, a bird's beak generated by oxidization of a lower insulation layer can be prevented during the oxidization process for curing etching damages caused by selectively etching a gate electrode. Also, since an upper insulation layer is not exposed during the ion implantation process for forming a source/drain region, the upper insulation layer is not attacked. In addition, because the upper insulation layer is composed of a higher k-dielectric material than the lower insulation layer, a leakage current is prevented. Consequently, nonvolatile memory devices are reliably achieved.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A nonvolatile memory device comprising:
   a substrate;
   a field region defining an active region of the substrate;
   a plurality of gate electrodes crossing a region of the active region;
   a gate insulation layer disposed between the active region and the gate electrode, the gate insulation layer including a lower insulation layer formed on an entire surface of the active region, a charge storing layer, and an upper insulation layer formed on less than the entire area of the active region; and
   an impurity region formed in areas of the active region between the gate electrodes.

2. The nonvolatile memory device of claim 1, further comprising a thermal oxide layer formed on sidewalls of the plurality of gate electrodes.

3. The nonvolatile memory device as of claim 1, wherein the charge storing layer extends over the active region that lies between the plurality of gate electrodes.

4. The nonvolatile memory device of claim 1, further comprising spacers formed on sidewalls of the plurality of gate electrodes.

5. The nonvolatile memory device of claim 1, wherein the upper insulation layer and the charge storing layer extend in the areas of the active region that lie between the plurality of gate electrodes less than one-half the distance between two adjacent gate electrodes.

6. The nonvolatile memory device of claim 5, further comprising spacers formed on sidewalls of the plurality of gate electrodes,
   wherein a width at the bottom of the spacer equals the predetermined distance.

7. The nonvolatile memory device of claim 1, wherein the upper insulation layer has a higher dielectric constant than the lower insulation layer.

8. The nonvolatile memory device of claim 1, wherein the gate electrodes comprise a lower gate electrode and an upper gate electrode, and wherein the upper gate electrode is substantially line-shaped and connects at least two of the gate electrodes by crossing the field region.

9. The nonvolatile memory device of claim 8, further comprising a silicide layer formed on the upper gate electrode.

10. The nonvolatile memory device of claim 8, wherein the field region fills a gap between the lower gate electrodes and is aligned with the lower gate electrode.

11. The nonvolatile memory device of claim 1, wherein the lower insulation layer is a silicon oxide layer.

12. The nonvolatile memory device of claim 1, wherein the charge storing layer is a silicon nitride layer.

13. The nonvolatile memory device of claim 1, wherein the upper insulation layer is composed of at least one of the materials selected from the group containing silicon oxide, metal oxides from elements of group III and VB in the Mendeleev Periodic Table, oxides obtained by doping elements of group IV into said metal oxides, $HfO_2$, and $Hf_{1-x}Al_xO_y$.

14. The nonvolatile memory device of claim 1, wherein the charge storing layer is formed on less than an entire area of the active region.

* * * * *